US010056363B2

(12) United States Patent
Chang et al.

(10) Patent No.: US 10,056,363 B2
(45) Date of Patent: Aug. 21, 2018

(54) METHODS AND SYSTEMS TO IMPROVE YIELD IN MULTIPLE CHIPS INTEGRATION PROCESSES

(71) Applicant: Marvell World Trade Ltd., St. Michael (BB)

(72) Inventors: Runzi Chang, San Jose, CA (US); Winston Lee, Palo Alto, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/296,829

(22) Filed: Oct. 18, 2016

(65) Prior Publication Data

US 2017/0133358 A1 May 11, 2017

Related U.S. Application Data

(60) Provisional application No. 62/253,223, filed on Nov. 10, 2015.

(51) Int. Cl.
H01L 25/18 (2006.01)
H01L 21/28 (2006.01)
H01L 21/322 (2006.01)
H01L 21/56 (2006.01)
H01L 21/67 (2006.01)
H01L 25/00 (2006.01)
(Continued)

(52) U.S. Cl.
CPC ........ *H01L 25/18* (2013.01); *H01L 21/28185* (2013.01); *H01L 21/3221* (2013.01); *H01L 21/565* (2013.01); *H01L 21/67017* (2013.01); *H01L 21/67109* (2013.01); *H01L 21/67126* (2013.01); *H01L 25/50* (2013.01); *H01L 27/10873* (2013.01); *H01L 21/568* (2013.01);

*H01L 24/20* (2013.01); *H01L 24/96* (2013.01); *H01L 24/97* (2013.01); *H01L 2224/04105* (2013.01); *H01L 2224/12105* (2013.01); *H01L 2224/24137* (2013.01); *H01L 2924/10253* (2013.01); *H01L 2924/1436* (2013.01); *H01L 2924/37001* (2013.01)

(58) Field of Classification Search
CPC . H01L 25/18; H01L 21/565; H01L 21/28185; H01L 27/10873; H01L 21/67017; H01L 25/50; H01L 21/67126; H01L 21/67109; H01L 21/3221
See application file for complete search history.

(56) References Cited

U.S. PATENT DOCUMENTS

| 6,107,184 A * | 8/2000 | Mandal | B05D 1/60 |
| | | | 257/E21.259 |
| 2011/0287922 A1 * | 11/2011 | Ikenishi | C03C 3/247 |
| | | | 501/44 |
| 2012/0187598 A1 * | 7/2012 | Lee | B29C 43/18 |
| | | | 264/272.15 |

OTHER PUBLICATIONS

"Epoxy", from Wikipedia, the free encyclopedia, https://en.wikipedia.org/wiki/Epoxy, downloaded from the Internet Aug. 31, 2017, 12 pages.

* cited by examiner

Primary Examiner — Kyoung Lee

(57) ABSTRACT

The present disclosure includes systems and techniques relating to methods and systems that improve yield in multiple chips integration processes. In some implementations, a method includes providing, in a chamber, a first integrated circuit chip and a second integrated circuit chip supported on a carrier, flowing a molding compound to cover the first integrated circuit chip, the second integrated circuit chip, and the carrier; and flowing a forming gas into the chamber while curing the molding compound.

21 Claims, 5 Drawing Sheets

(51) Int. Cl.
*H01L 27/108* (2006.01)
*H01L 23/00* (2006.01)

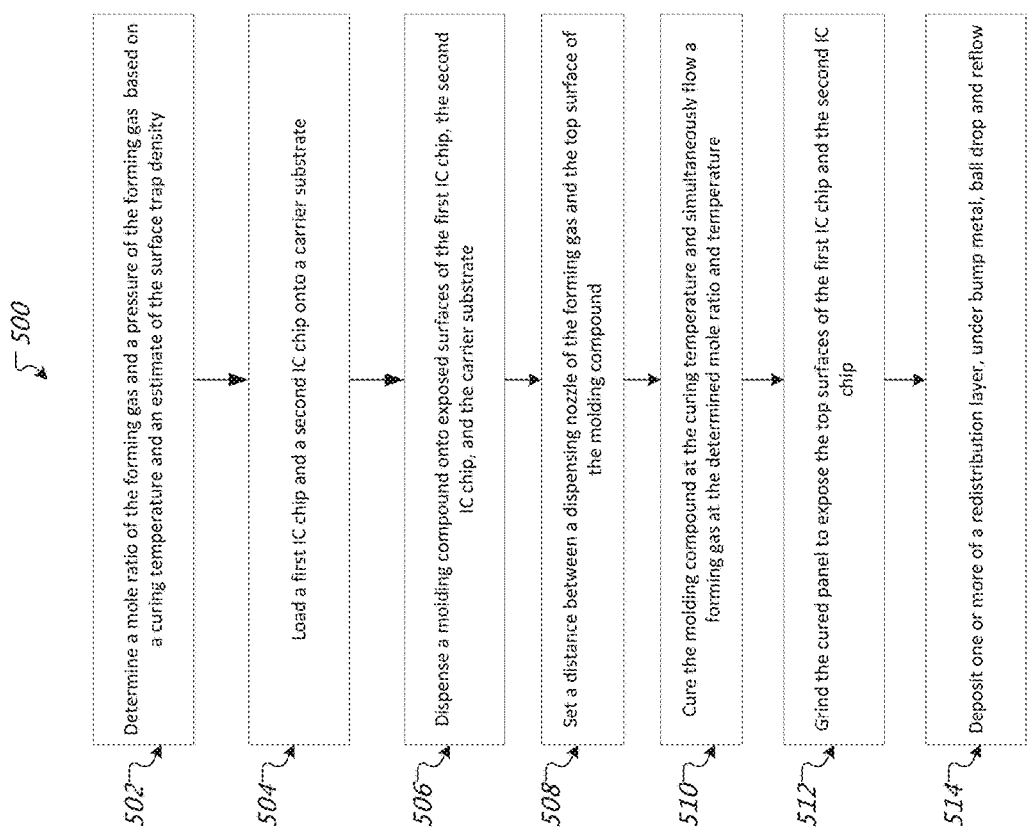

METHODS AND SYSTEMS TO IMPROVE YIELD IN MULTIPLE CHIPS INTEGRATION PROCESSES

CROSS REFERENCE TO RELATED APPLICATIONS

This application claims the benefit of the priority of U.S. Provisional Application Ser. No. 62/253,223, filed Nov. 10, 2015 and entitled "Method to improve memory yield in multiple chips integration process", which is hereby incorporated by reference in its entirety.

BACKGROUND

The present disclosure describes systems and techniques relating to semiconductor manufacturing, more particularly to packaging of semiconductors.

Multiple chip 3-dimensional (3D) integration is a way for modern integrated circuits technology to package memory chips in ways that provide continuously increasing functionalities in ever more powerful electronic systems. 3D integration processes can include multi-chip integration processes such as fan-out molding processes. Such fan-out molding processes can involve high temperature (e.g., >200° C.) processes for meeting manufacturing quality specifications. Molding generally involves flowing melted epoxy compound onto exposed surfaces of chip areas at temperatures typically around 180° C. The epoxy compound can then be cured at similar or slightly elevated temperatures (e.g., 180° C. to 260° C.) to achieve cross-linking that finalizes the 3D chips integration process.

SUMMARY

The present disclosure includes systems and techniques that improve yield in multiple chips integration processes.

According to an aspect of the described systems and techniques, an apparatus includes, a chamber having a gas outlet port; a platen positioned within the chamber and configured to support a substrate; a material introduction port defined through a first opening in the chamber; a gas introduction port configured to deliver a fully adjustable mixture of gas into the chamber; a controller configured to determine a mole ratio, a pressure, and a temperature of a mixture of gas to be flown through the gas introduction port, and a heater configured to cure a molding compound dispensed through the gas introduction ported.

Implementations can include one or more of the following. The apparatus includes a first valve and a second valve, each valve being configured to be adjusted based on a control signal from the controller to supply a first amount of a first gas at a first pressure, and a second amount of a second gas at a second pressure, respectively to the gas introduction port. The apparatus includes a heater configured to heat the fully adjustable mixture of gas before it is delivered through the gas introduction port into the chamber. The apparatus includes an actuator configured to translate the platen in three orthogonal directions. The apparatus includes a top cover of the chamber. The material introduction port is formed integrally with the top cover. The gas introduction port includes a plurality of nozzles arranged in concentric circles about a central nozzle. The gas introduction port has a width that spans a width of the platen. The heater is positioned within the platen. The gas introduction port is configured to deliver the fully adjustable mixture of gas when the heater is in operation. The material introduction port is a portion of a dispensing device, the dispensing device having an actuator that is configured to translate the introduction port in two perpendicular directions.

According to another aspect of the described systems and techniques, a method includes minimizing yield losses in multiple chip integration, the method includes providing, in a chamber, a first integrated circuit chip and a second integrated circuit chip supported on a carrier; flowing a molding compound to cover the first integrated circuit chip, the second integrated circuit chip, and the carrier; and flowing a forming gas into the chamber while curing the molding compound.

Implementations can include one or more of the following features. The forming gas includes $H_2$ and $N_2$. The method includes controlling a pressure of the forming gas in the chamber to increase permeation of the forming gas into a gate oxide and a silicon surface of the first integrated circuit chip. The d includes controlling a temperature of the forming gas to increase permeation of the forming gas into the gate oxide and the silicon surface of the first integrated circuit chip. Flowing the forming gas into the chamber includes introducing the forming gas through a plurality of nozzles defined in a top cover of the chamber. The plurality of nozzles is arranged concentrically about a central nozzle. The method includes adjusting a distance between the plurality of nozzles and the first integrated circuit chip, and a mole fraction ratio of $H_2$ and $N_2$. Curing the molding compound occurs at a temperature between 180° C.-300° C. The first integrated circuit chip includes a dynamic random access memory (DRAM) chip, the second integrated circuit chip includes a system on chip (SoC), and minimizing yield losses includes reducing DRAM data retention time degradation. Reducing DRAM data retention time degradation includes reducing a number of broken silicon-to-hydrogen bonds resulting from the curing, by reforming one or more broken bonds using the forming gas.

The described systems and techniques can include controllers that are implemented in electronic circuitry, computer hardware, firmware, software, or in combinations of them. This can include at least one computer-readable medium embodying a program operable to cause one or more data processing apparatus (e.g., a controller including a programmable processor) to perform operations described.

The described systems and techniques can result in a reduction (e.g., elimination) of issues associated with high temperature manufacturing processes that occur in an atmospheric environment for integrated circuits such as Dynamic Random Access Memory (DRAM) chips. Such issues include the reduction in performance parameters of the chips due to chemical degradation of the integrated circuits.

Details of one or more implementations are set forth in the accompanying drawings and the description below. Other features and advantages may be apparent from the description and drawings, and from the claims.

DRAWING DESCRIPTIONS

FIG. 5 is a flowchart showing a 3D integration process that does not negatively impact the retention time of a DRAM chip.

DETAILED DESCRIPTION

The systems and techniques described herein can be implemented to package one or more devices, such as one or more integrated circuit (IC) devices, in electronic systems (e.g., a wireless communication device, an electronic data storage device, a channel medium access access/control device).

Figure 1:
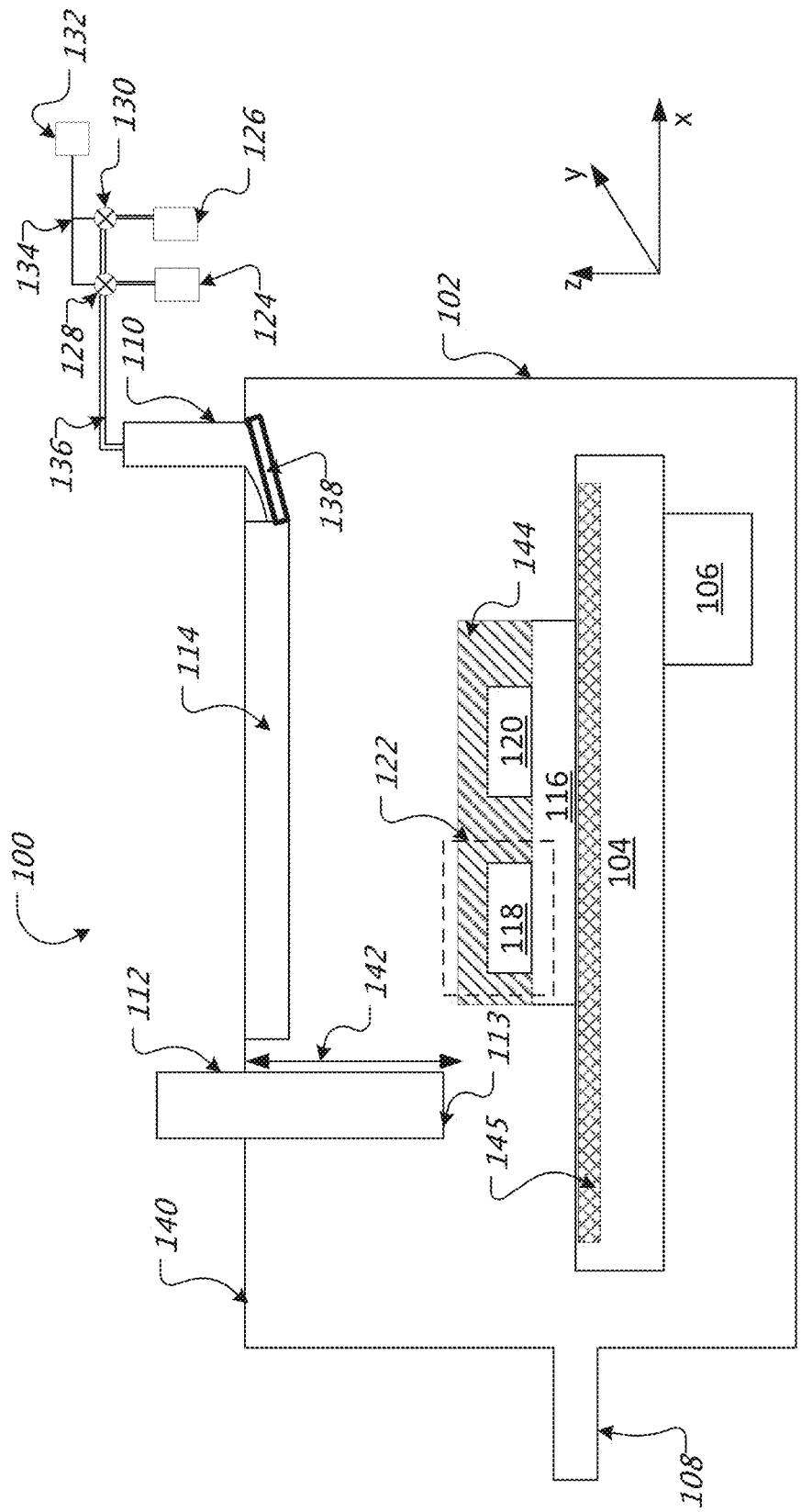
FIG. 1 shows a system used to 3D package multiple IC chips.

FIG. 1 shows a system 100 that can be used to package semiconductor components. The system 100 includes a chamber 102. Within the chamber 102 is a platen 104, which can be actuated by an actuator 106 along three orthogonal directions (e.g., the x, y, and z directions). The chamber 102 can be evacuated via a gas outlet port 108 by vacuum pumps (not shown) to remove atmospheric gases from within the chamber 102, so that the atmospheric environment is replaced by a vacuum environment. A selected gas or gas mixture can be channeled into the chamber 102 through an inlet port 110. The inlet port 110 is connected to a dispensing head 114 that includes nozzles through which gases can be introduced into the chamber 102.

Figure 2:
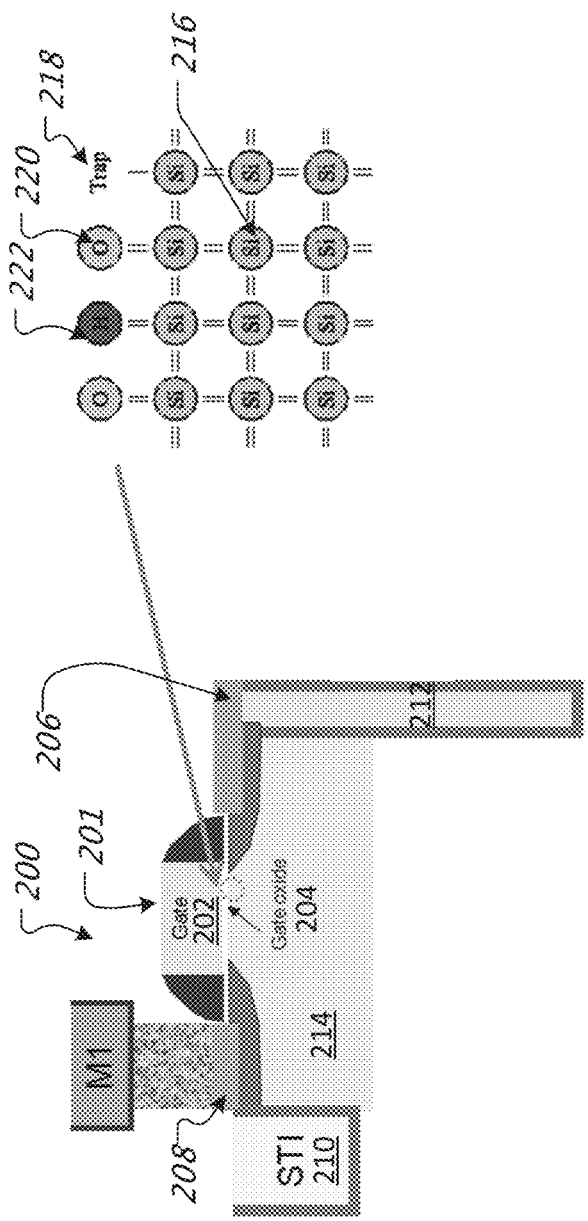
FIG. 2 shows an interface between an IC chip and a silicon substrate.

A carrier substrate 116 supporting a first IC device 118 and a second IC device 120 is placed on the platen 104. While only the carrier substrate 116 is shown schematically in FIG. 1, the carrier substrate 116 can also include a backside laminate (not shown). A magnified view of the region contained within a dotted box 122 is shown in FIG. 2.

A material introduction device 112 having an introduction port 113 is used to deliver a molding compound 144 to the first IC device 118 and the second IC device 120. The introduction device 112 can be translatable along the x-y directions or the device can be stationary and the actuator 106 can be used to position the carrier substrate 116 underneath the device 112 to receive the molding material 144.

The molding material 144 can be an epoxy. Epoxy is a term used to denote both the basic components and the cured end products of epoxy resins, as well as a colloquial name for the epoxide functional group. Epoxy resins, also known as polyepoxides are a class of reactive prepolymers and polymers which contain epoxide groups. Epoxy resins may be reacted (cross-linked) either with themselves through catalytic homopolymerisation, or with a range of co-reactants including polyfunctional amines, acids (and acid anhydrides), alcohols and thiols. These co-reactants are often referred to as hardeners or curatives, and the cross-linking reaction is commonly referred to as curing. Reaction of polyepoxides with themselves or with polyfunctional hardeners forms a thermosetting polymer, often with high mechanical properties, temperature and chemical resistance. The epoxy compound does not melt down even by high temperature once it is cured.

Heaters can be positioned at any suitable location within the chamber 102 to increase the temperature of the molding compound during the curing process to harden the molding compound 144. For example, a heater 145 can be placed within the platen 104.

FIG. 2 shows a portion of a DRAM 200 that is a part of the IC device 118. Information on the DRAM 200 is stored as charge on a capacitor, for example, trench capacitor 212 as shown in FIG. 2. The DRAM 200 has one access transistor 201 and one capacitor 212 per cell. DRAMs are periodically refreshed to compensate for charges that can leak away. For example, DRAMs can be refreshed every 5-50 milliseconds.

The transistor 201 includes a gate electrode 202 and a gate oxide layer 204 deposited on a semiconductor substrate 214. The semiconductor substrate 214 can be, for example, silicon. The gate oxide layer 204 is a dielectric layer that separates the gate electrode 202 from a source electrode 206 and a drain electrode 208, as well as the conductive channel that connects that source a drain when the transistor 200 is turned on.

M1 is a first metal that forms the first level of metal interconnection in a memory chip. M1 connects to the drain electrode 208 for access to external signals (e.g., in read and write operations). A metal contact connects M1 and the access transistor active region. The gate oxide layer 204 can be formed by oxidizing the silicon of the channel to form a thin (e.g., 5-200 nm) insulating layer of silicon dioxide. The gate 202 is formed by depositing a conductive gate material over the gate oxide layer 204 to form the transistor 200. The gate oxide layer 204 serves as the dielectric layer so that the gate can sustain the electric field used to modulate the conductance of a channel between the source and drain electrodes.

A shallow trench isolation (STI) 210, an integrated circuit feature which prevents electric current leakage between adjacent semiconductor device components, can also be included. The STI 210 can be created early during the semiconductor device fabrication process, before transistors are formed by etching a pattern of trenches in the silicon, depositing one or more dielectric materials (such as silicon dioxide) to fill the trenches.

The interface between the gate oxide layer 204 and the silicon substrate 214 can influence the performance of the DRAM 200. As shown in the expanded inset on the right of FIG. 2, a silicon atom 216 typically possesses four valence electrons and therefore four bonds are formed to fully saturate the valence shell. In the crystalline structure of the bulk silicon substrate 214, each silicon atom establishes bonds to its four neighboring atoms, leaving no unsaturated bond behind.

At the silicon-silicon dioxide interface, silicon in the silicon substrate 214 can bond to oxygen 220 from silicon dioxide, but one or more silicon crystal atoms can also be missing, resulting in a dangling silicon bond that forms a trap 218 (and a defect). The defect is electrically active and impacts the balance of charges in the transistor 201. For example, depending on the polarity of charge associated with the defect caused by the dangling bond, the threshold voltage that is used to control the flow of charges between the source and drain electrodes can shift either higher or lower. Such voltage shifts can cause charges to leak out of the capacitor 212 more easily, or make it more difficult for the capacitor 212 to receive charges. A functioning DRAM retains information stored as charges within the capacitor between refreshing cycles. For example, DRAMs can be refreshed every 5-50 milliseconds. Due to the transistor threshold voltage shift, the DRAM may no longer be able to retain the information in between refreshing cycles, leading to DRAM failure caused by DRAM data retention degradation. When a DRAM chip no longer meets a specification for retention time, the failed DRAM chip can contribute to retention time yield loss. In addition to the defects induced device threshold voltage shifts, trap-induced Gate induced Drain Leakage (GIDL) can also cause DRAM retention time failures.

A hydrogen atom 222 can cap the silicon in a silicon dangling bond (i.e., a silicon atom that has one or more unsaturated bonds) to eliminate the defect formed by an unpaired valence electron of a silicon atom back-bonded to three other silicon atoms. During the manufacture of IC chips (prior to their 3D packaging), these silicon bonds are generally passivated in post-metallization processes by the use of forming gas that contains hydrogen gas ($H_2$).

During the 3D packaging process, temperatures as high as 200 to 260° C. can be used during the curing process. Such curing temperatures can lead to chemical degradation of the passivated silicon bonds at the interface between the integrated circuits and the silicon substrate, resulting in dangling silicon bonds. In other words, breakage of Si—H bonds at elevated temperatures during curing can re-activate the interface via traps formed by the silicon dangling bonds.

For example, curing at temperatures between 200-260° C. in 3D integration processes can result in more than 5% system yield loss of IC chips that are to be integrated. The failure mode of the DRAM chips can predominately be the DRAM data retention time degradation. Such degradation is generally caused by Si—H bond breakage in an atmospheric or low pressure environment, at temperatures about 180° C. during the 3D packaging molding/cure processes.

Figure 3:
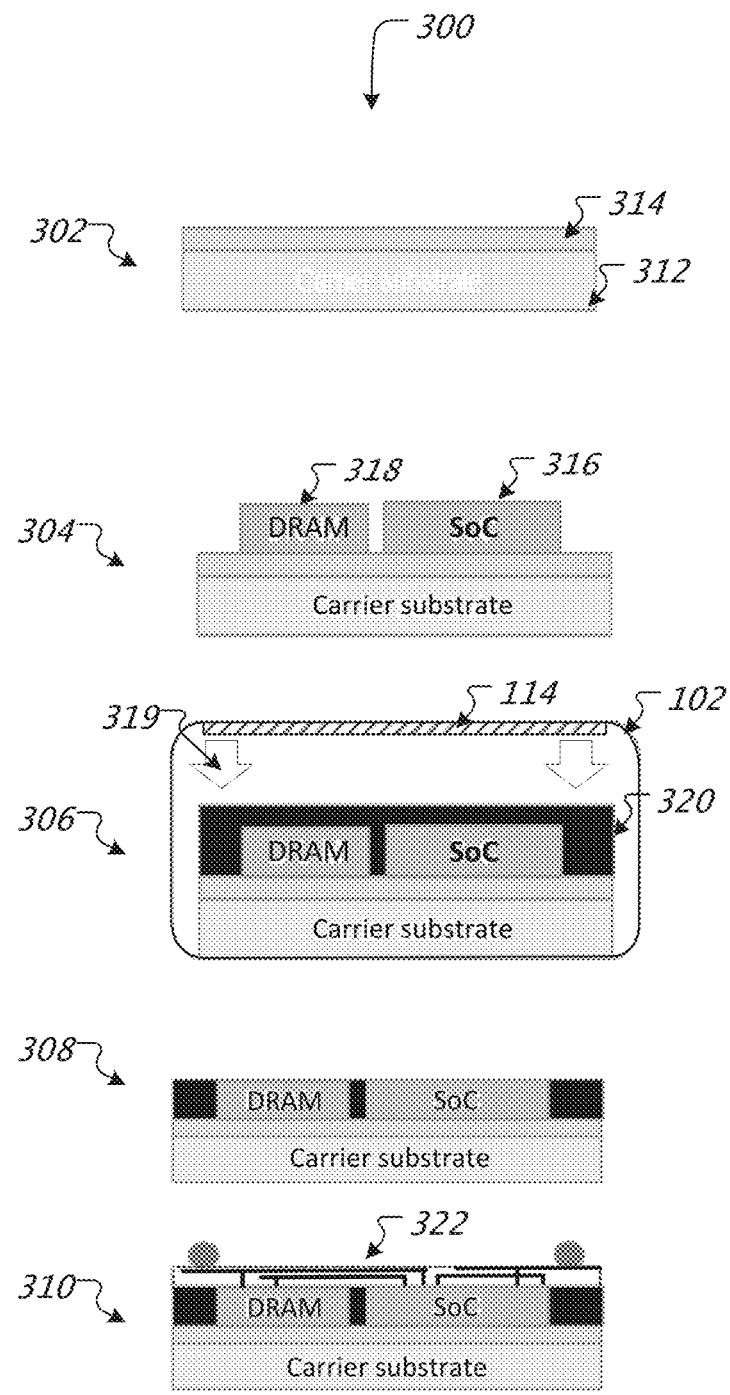
FIG. 3 shows a 3D packaging fan-out integration process.

FIG. 3 illustrates a 3D integration process 300 involving a DRAM chip 318 and a system of chip (SoC) chip 316. At 302, a carrier substrate 312 can be provided with a backside laminate 314. Subsequently at 304, the DRAM chip 318 and the SoC chip 316 are loaded and positioned on the carrier substrate 312. At 306, the chips and the substrate are then placed in a process chamber 102, where a molding compound 320 is dispensed onto and around the chips 316 and 318. Molding generally involves flowing a melted epoxy compound onto exposed surfaces of the chips at temperatures typically around 180° C. The epoxy compound can then be cured at similar or slightly elevated temperatures (e.g., 180° C. to 260° C.) to achieve cross-linking that finalizes the 3D chips integration process, producing a panel or package in which the cured compound encapsulates the DRAM and SoC chip. Such encapsulation can help prevent physical damage and corrosion of the chips. At 308, after curing, the panel can be ground down to expose the embedded DRAM and SoC chips. At 310, other processes, such as the deposition of a redistribution layer (RDL), under bump metal (UMB), ball drop and a reflow process. The RDL is an extra metal layer on a chip that makes the IO pads of an integrated circuit available in other locations on the chip. The 3D packaging process can then be completed following delamination and die sawing.

The system 100 can be used to reduce (e.g., eliminate) yield losses due to the elevated temperatures used at 306. By using a better controlled environment, surface traps created by Si—H bond breakage at elevated temperatures in the molding and curing process (i.e., at 306) can be repaired, which in turn minimizes the DRAM and system yield loss.

During the curing process at elevated temperatures at 306, broken Si—H bonds can be repaired by flowing a forming gas 319 (e.g., through a dispensing head 114) into the process chamber 102. The forming gas 319 can include a mixture of hydrogen gas ($H_2$) and nitrogen gas ($N_2$). In addition to hydrogen gas $H_2$, hydrogen radicals and/or hydrogen ions can be used in the forming gas 319. In such cases, the hydrogen ions or radicals are generated remotely in another radio-frequency (RF)-powered chamber prior to delivery to the forming gas treatment chamber. The mole composition (between Hydrogen and Nitrogen) of the forming gas is fully adjustable. The ratio of the hydrogen gas to nitrogen gas can be adjusted based on application. In general, the forming gas contains about 5-15% of hydrogen gas. The inclusion of the inert nitrogen gas can help to improve process safety, due to the reactivity of hydrogen gas. In addition, the formation of Si—H bonds is an exothermic process, and controlling the amount of hydrogen gas in the formation gas mixture can help to optimize the repair of Si—H bonds.

The ratio of the formation gas can be modified by a controller 132 which sends electronic control signals 134 to valves 128 and 130, associated with a nitrogen gas tank 124, and a hydrogen gas tank 126, respectively. By opening the valves 128 and 130 to different degrees, forming gas having different ratios of hydrogen and nitrogen can be mixed in the gas delivery system 136 and directed to the inlet port 110. A pressure of the gas mixture can also be controlled by the valves 128 and 130.

The inlet port 110 can also include a heater 138, also controlled by the controller 132 (electrical connections are not shown), that delivers the gas at a selected temperature to the dispensing head 114. For example, when an optimal ratio of hydrogen gas and nitrogen gas is used for the forming gas, it can be delivered at temperatures as high as between 400-450° C. into the chamber 102. Introducing the forming gas at a higher temperature and/or higher pressure can increase the rate of Si—H bond repair by more effective permeation of $H_2$ into the interface between silicon and the gate oxide layer. The goal is to heal Si—H broken bonds (i.e., re-forming the Si—H bond) by the forming gas, at temperature and pressure combinations under which the healing rate exceeds the bond breaking rate, without affecting the curing process.

Even when the forming gas is delivered at temperatures between 400-450° C., curing can still occur at temperatures below 400-450° C. when the heat for the curing is provided via thermal conduction from the heater 145 through the substrate 116 into the molding compound 144. In other words, the heated forming gas do not need to supply the heat used for curing the molding compound 144. By using the forming gas to provide a controlled environment, the finished products can have a higher quality, with a much lower defect rate. In general, curing is carried out at the highest temperature before the bond breaking rate exceeds the bond healing rate, in the absence of other limiting factors (e.g., temperature at which materials, such as aluminum, alloys, degrade or melts).

For applications in which more surface traps of silicon dangling bonds are expected, for example, when high dielectric constant films are deposited on silicon substrates as the gate oxide layer, the percentage composition of hydrogen gas in the forming gas mixture can be increased to 15-25%.

The controller 132 and the valves 128 and 130 can also be used to adjust a pressure of the gas delivered into the chamber 102 through the dispensing head 114. In general, the pressure of the forming gas introduced into the chamber 102 is between 1 atm to 10 atm. For example, a higher pressure in the chamber 102 can increase the permeation of $H_2$ into the interface between the gate oxide layer 204 and the silicon substrate 124, allowing better channel surface passivation. Channel surface passivation refers to the repairing of a dangling silicon bond by passivating the silicon with a hydrogen radical to form a Si—H bond, in the channel region (e.g., between the source electrode 206 and drain electrode 208) of a transistor. The formation of Si—H bonds helps to minimize interface traps, helping the transistor maintain a threshold voltage within its specification.

By adding the controls of temperature and pressure, the disclosed systems would have the capabilities to produce a fully-adjustable mixture of forming gas and tradeoff other meaningful parameters such as healing time (i.e., system throughput). For example, if the temperature and/or the pressure of the forming gas is not sufficiently high, reforming of the Si—H bond can take a longer time than the time needed for curing the 3D package, thus reducing the system 3D packaging throughput.

By healing, forming or re-forming any broken Si—H during the curing at 306, the curing can occur at a (low) temperature of around or greater than 180° C. The ability to provide a forming gas at a higher pressure (i.e., 1-10 atm) an enabler of Si—H bond repairs.

Instead of having a dispensing head that is separate from a top cover 140 of the chamber 120, the dispensing head can be fabricated as an integral part of the top cover. In general, the actuator 106 can be used to adjust a distance 142 between the top cover 140 of the chamber 102 and the surface of the molding compound 144 based on engineering result needs. The distance 142 can be adjustable from zero to certain height(s) based on process requirements.

Examples of engineering results needed include the finished panel surface roughness, stress, or other characteristics. An example of a process requirement is the gas flow inside the chamber.

Figure 4:
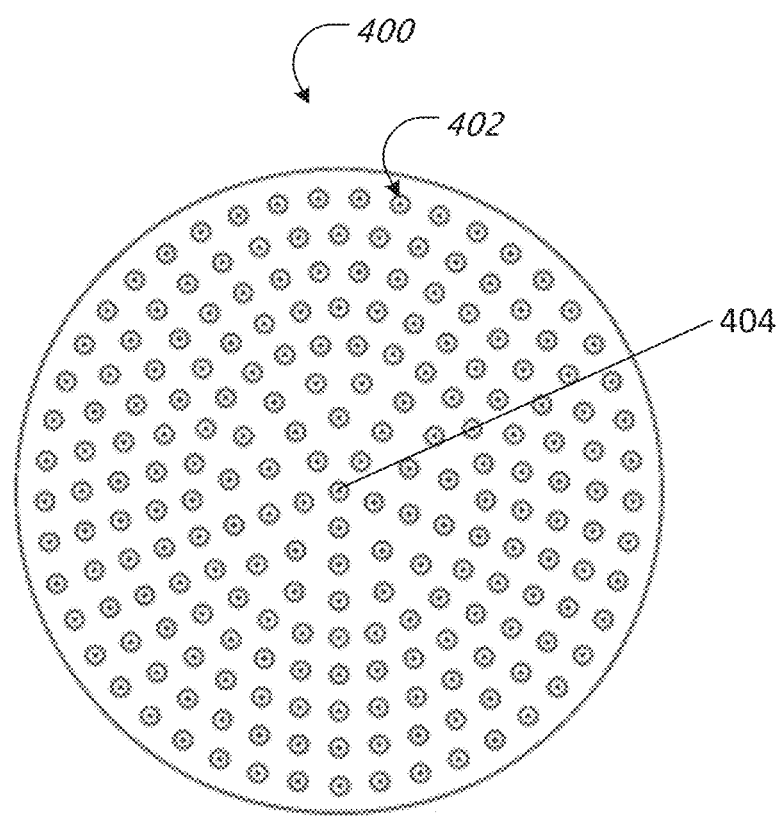
FIG. 4 shows an arrangement of nozzles that can be used to supply forming gas in the system shown in FIG. 1.

To achieve better uniformity in the delivery of the forming gas, the dispensing head 114, which can be a separate element or integrally formed into the top cover 140 of the chamber 102 can be designed in a shape similar to a showerhead. FIG. 4 shows a showerhead configuration 400, in which nozzles 402 are arranged in concentric circles about a central nozzle 404. In some implementations, a width of the showerhead configuration 400 covers the entire width of the top cover 140.

FIG. 5 shows a process 500 based on the methods and systems disclosed herein to maintain high yield during the 3D integration process of memory chips. At 502, a controller (e.g., controller 132) determines a mole ratio of the forming gas and pressure of the forming gas to be delivered into a process chamber (e.g., chamber 102). The controller 132 includes, in one embodiment, a processor used for determining the mole ratio of hydrogen gas and nitrogen gas, and pressure based on the curing temperature and an estimate of the surface trap density. An IC chip that uses high dielectric materials as the gate oxide layer can have a higher density of surface traps.

In such cases, a higher ratio (e.g., between 15-25% by volume) of hydrogen gas is provided in the forming gas. The pressure of the forming gas is also adjusted based on conditions of the 3D packaging process (e.g., using the valves 128 and 130). When curing occurs at a higher temperature, forming gas of a higher pressure is delivered into the chambers to help increase the permeation of the forming gas into the interface between the IC chips and the silicon substrate in passivating dangling silicon bonds.

At 504, the first IC chip and a second IC chip are loaded onto a carrier substrate. Additional IC chips can be loaded onto carrier substrate to be integrated in the 3D packaging process, depending on the application. The carrier substrate is supported by a platen (e.g., platen 104) which can be translated along three orthogonal directions.

At 506, a material introduction device (e.g., the material introduction device 112) dispense a molding compound, such as an epoxy that has not yet been cured, to cover the exposed surfaces of the first integrated circuit chip and the second integrated circuit chip. Either the material introduction device 112 can be actuated, or the carrier substrate can be translated to be positioned under the material introduction device 112 to receive the molding material.

A vertical distance is set at 508 between a dispensing nozzle of the forming gas and a top surface of the molding compound. The vertical distance can be zero, close to zero, or up to any distance suitable for the application. The dispensing nozzle can be defined in a dispensing head, or it can be formed as an integral part of a top cover of the process chamber. After the vertical distance is set, the platen is translated vertically to position the carrier substrate at the selected distance.

At 510, a heater (e.g., the heater 145) cures the molding compound at the curing temperature used to calculate the mole ratio and the pressure of the forming gas at 502. The molding compound is heated to the curing temperature. The heater can be a part of the platen, or it can be positioned elsewhere in the process chamber.

Simultaneous to the curing process, the forming gas is flown at the mole ratio, pressure, and temperature determined at 502. The curing can occur at the highest temperature possible, before the Si—H bond-breakage rate (due to the high temperature of curing) exceeds the Si—H reforming rate, to improve system throughput. In other words, the curing can be completed faster at a higher temperature, and more IC chips can be 3D packaged per unit time. Having the forming gas flow at the same time as the curing process can help ensure that the repairing of broken Si—H bonds do not negatively impact the throughput of the 3D packaging system. Additional process time is not needed to specifically heal the broken Si—H bond, separate from the time used for curing the molding compound.

At 512, after the molding compound is cured, the cured panel containing the 3D packaged chip is ground to expose the top surfaces of the first IC chip and the second IC chip. Thereafter, at 514, one or more of the following is deposited: a redistribution layer, under bump metal, and ball drop. A reflowing process can also occur after the deposition is complete. The reflowing process is used to form a metallic connection phase between under-bump metallization (UBM) and solder. After the solder is deposited, the reflow process is used to form homogeneous solder spheres. It is a preferred process in flip-chip packaging.

In general, besides fan-out molding processes, the forming gas can be used to heal broken Si—H bonds in other packing application. Fan-Out Wafer-Level Packaging (FOWLP) can package semiconductor chips with interconnect densities exceeding the capabilities of standard Wafer Level Chip Scale Packaging (WLCSP). In FOWLP, metal (e.g., copper) pillars can be fabricated at input/output (IO) locations on the native semiconductor wafer prior to covering the IC chips with a molding compound. The Cu pillars provide current pathways through the mold on the front die surface. Next, buildup processing is performed on the front panel surface with interconnection between the exposed Cu pillars and a bump array.

The methods and systems disclosed herein for introducing forming gas having a fully adjustable ratio of $H_2$ and $N_2$ into high temperature operations of 3D packaging processes can improve memory devices and system yield. The approaches disclosed herein are highly scalable to future generations of chip integration technologies.

Further aspects of the present invention relate to one or more of the following clauses.

A method for minimizing yield losses in multiple chip integration, the method includes providing, in a chamber, a first integrated circuit chip and a second integrated circuit chip supported on a carrier; flowing a molding compound to cover the first integrated circuit chip, the second integrated circuit chip, and the carrier; and flowing a forming gas into the chamber while curing the molding compound.

The forming gas includes $H_2$ and $N_2$. The method includes controlling a pressure of the forming gas in the chamber to increase permeation of the forming gas into a gate oxide and a silicon surface of the first integrated circuit chip. The method includes controlling a temperature of the forming gas to increase permeation of the forming gas into the gate oxide and the silicon surface of the first integrated circuit chip. Flowing the forming gas into the chamber includes introducing the forming gas through a plurality of nozzles defined in a top cover of the chamber. The plurality of nozzles is arranged concentrically about a central nozzle. The method includes adjusting a distance between the plurality of nozzles and the first integrated circuit chip, and a mole fraction ratio of $H_2$ and $N_2$. Curing the molding compound occurs at a temperature between 180° C.-300° C. The first integrated circuit chip includes a dynamic random access memory (DRAM) chip, the second integrated circuit chip includes a system on chip (SoC), and minimizing yield losses includes reducing DRAM data retention time degradation. Reducing DRAM data retention time degradation includes reducing a number of broken silicon-to-hydrogen bonds resulting from the curing, by reforming one or more broken bonds using the forming gas.

An apparatus includes a chamber having a gas outlet port; a platen positioned within the chamber and configured to support a substrate; a material introduction port defined through a first opening in the chamber; a gas introduction port configured to deliver a fully adjustable mixture of gas into the chamber; a controller configured to determine a mole ratio, a pressure, and a temperature of a mixture of gas to be flown through the gas introduction port, and a heater configured to cure a molding compound dispensed through the gas introduction ported.

The apparatus includes a first and a second valve, each valve being configured to be adjusted based on a control signal from the controller to supply a first amount of a first gas at a first pressure, and a second amount of a second gas at a second pressure, respectively to the gas introduction port. The apparatus includes a heater configured to heat the fully adjustable mixture of gas before it is delivered through the gas introduction port into the chamber. The apparatus includes an actuator configured to translate the platen in three orthogonal directions. The apparatus includes a top cover of the chamber. The material introduction port is formed integrally with the top cover. The gas introduction port includes a plurality of nozzles arranged in concentric circles about a central nozzle. The gas introduction port has a width that spans a width of the platen. The heater is positioned within the platen. The gas introduction port is configured to deliver the fully adjustable mixture of gas when the heater is in operation. The material introduction port is a portion of a dispensing device, the dispensing device having an actuator that is configured to translate the introduction port in two perpendicular directions.

A few embodiments have been described in detail above, and various modifications are possible. The term "controller" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a database management system, an operating system, or a combination of one or more of them.

A program (also known as a computer program, software, software application, script, or code) (e.g., used to control the controller) can be written in any form of programming language, including compiled or interpreted languages, or declarative or procedural languages, and it can be deployed in any form, including as a stand alone program or as a module, component, subroutine, or other unit suitable for use in a computing environment.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A method for minimizing yield losses in multiple chip integration, the method comprising:
    providing, in a chamber, a first integrated circuit chip and a second integrated circuit chip supported on a carrier;
    flowing a molding compound to cover the first integrated circuit chip, the second integrated circuit chip, and the carrier; and
    flowing a forming gas into the chamber while curing the molding compound, wherein the forming gas comprises $H_2$.

2. The method of claim 1, wherein the forming gas further comprises $N_2$.

3. An apparatus comprising:
    a chamber having a gas outlet port;
    a platen positioned within the chamber and configured to support a substrate;
    a material introduction port defined through a first opening in the chamber;
    a gas introduction port configured to deliver a fully adjustable mixture of gas into the chamber;
    a controller configured to determine a mole ratio, a pressure, and a temperature of the fully adjustable mixture of gas to be flowed through the gas introduction port, and
    a heater configured to cure a molding compound on the substrate when the fully adjustable mixture of gas is present in the chamber, the molding compound dispensed through the material introduction port.

4. The apparatus of claim 3, further comprising a first valve and a second valve, each valve being configured to be adjusted based on a control signal from the controller to supply a first amount of a first gas at a first pressure, and a second amount of a second gas at a second pressure, respectively to the gas introduction port.

5. The apparatus of claim 3, further comprising a heater configured to heat the fully adjustable mixture of gas before it is delivered through the gas introduction port into the chamber.

6. The apparatus of claim 3, further comprising an actuator configured to translate the platen in three orthogonal directions.

7. The apparatus of claim 3, further comprising a top cover of the chamber, wherein the material introduction port is formed integrally with the top cover.

8. The apparatus of claim 3, wherein the gas introduction port comprises a plurality of nozzles arranged in concentric circles about a central nozzle.

9. The apparatus of claim 3, wherein the gas introduction port has a width that spans a width of the platen.

10. The apparatus of claim 3, wherein the heater is positioned within the platen.

11. The apparatus of claim 10, wherein the controller is configured to deliver the fully adjustable mixture of gas through the gas introduction port when the heater is in operation.

12. The apparatus of claim 3, wherein the material introduction port is a portion of a dispensing device, the dispensing device having an actuator that is configured to translate the introduction port in two perpendicular directions.

13. A method for minimizing yield losses in multiple chip integration, the method comprising:
providing, in a chamber, a first integrated circuit chip and a second integrated circuit chip supported on a carrier;
flowing a molding compound to cover the first integrated circuit chip, the second integrated circuit chip, and the carrier;
determining a mole ratio of $H_2$ and $N_2$ in a forming gas; and
flowing the forming gas into the chamber while curing the molding compound.

14. The method of claim 13, further comprising controlling a pressure of the forming gas in the chamber to increase permeation of the forming gas into a gate oxide and a silicon surface of the first integrated circuit chip.

15. The method of claim 14, further comprising controlling a temperature of the forming gas to increase permeation of the forming gas into the gate oxide and the silicon surface of the first integrated circuit chip.

16. The method of claim 13, wherein flowing the forming gas into the chamber comprises introducing the forming gas through a plurality of nozzles defined in a top cover of the chamber.

17. The method of claim 16, wherein the plurality of nozzles is arranged concentrically about a central nozzle.

18. The method of claim 16, further comprising adjusting a distance between the plurality of nozzles and the first integrated circuit chip.

19. The method of claim 13, wherein curing the molding compound occurs at a temperature between 180° C. and 300° C., inclusive.

20. The method of claim 13, wherein the first integrated circuit chip comprises a dynamic random access memory (DRAM) chip, the second integrated circuit chip comprises a system on chip (SoC), and minimizing yield losses comprises reducing DRAM data retention time degradation.

21. The method of claim 20, wherein reducing DRAM data retention time degradation comprises reducing a number of broken silicon-to-hydrogen bonds resulting from the curing, by reforming one or more broken bonds using the forming gas.

* * * * *